(12) United States Patent
Chen et al.

(10) Patent No.: US 7,642,820 B2
(45) Date of Patent: Jan. 5, 2010

(54) TRIANGLE WAVE GENERATOR AND SPREAD SPECTRUM CONTROL CIRCUIT THEREOF

(75) Inventors: Chin-Yang Chen, Hsinchu (TW); Jian-Wen Chen, Hsinchu (TW)

(73) Assignee: Elite Semiconductor Memory Technology Inc., Hsinchu (TW)

(*) Notice: Subject to any disclaimer, the term of this patent is extended or adjusted under 35 U.S.C. 154(b) by 65 days.

(21) Appl. No.: 11/963,856

(22) Filed: Dec. 24, 2007

(65) Prior Publication Data
US 2009/0160503 A1   Jun. 25, 2009

(51) Int. Cl.
*H03K 4/06* (2006.01)
(52) U.S. Cl. ........................ 327/131; 327/134
(58) Field of Classification Search .......... 326/21–24, 326/26–27, 80, 82–83, 87; 327/108–112, 327/131–134
See application file for complete search history.

(56) References Cited

U.S. PATENT DOCUMENTS

| 6,847,257 B2 | 1/2005 | Edwards et al. |
| 6,930,520 B2 * | 8/2005 | Solie .................... 327/131 |
| 2009/0160495 A1 * | 6/2009 | Chen et al. ............. 327/108 |

* cited by examiner

*Primary Examiner*—Long Nguyen
*Assistant Examiner*—Shikha Goyal
(74) *Attorney, Agent, or Firm*—Jianq Chyun IP Office (57) ABSTRACT

A triangle wave generator with function of spreading frequency spectrum is provided. The triangle wave generator includes a switch control circuit, a current generator, an integrator, and a spread spectrum control circuit. The switch control circuit provides an internal clock and a switch control signal. The current generator is coupled to the switch control circuit and provides charge current according to the switch control signal. The integrator is coupled to the current generator and provides a triangle wave signal. The spread spectrum control circuit is coupled to the switch control circuit and the current generator for providing a current control signal according to the internal clock.

10 Claims, 10 Drawing Sheets

TRIANGLE WAVE GENERATOR AND SPREAD SPECTRUM CONTROL CIRCUIT THEREOF

BACKGROUND OF THE INVENTION

1. Field of the Invention

The present invention relates to a triangle wave generator. More particularly, the present invention relates to the spread spectrum mechanism of a triangle wave generator.

2. Description of the Related Art

Periodic waveforms such as clock and triangle wave signal are very common in modern electronic circuits. In order to prevent electromagnetic interference (EMI) caused by harmonic of one single frequency, spread spectrum skill is applied. Spread spectrum spreads the frequency of periodic waveforms within a specific range so that their energy is distributed over the frequency spectrum. EMI can be prevented in this way.

Figure 1:
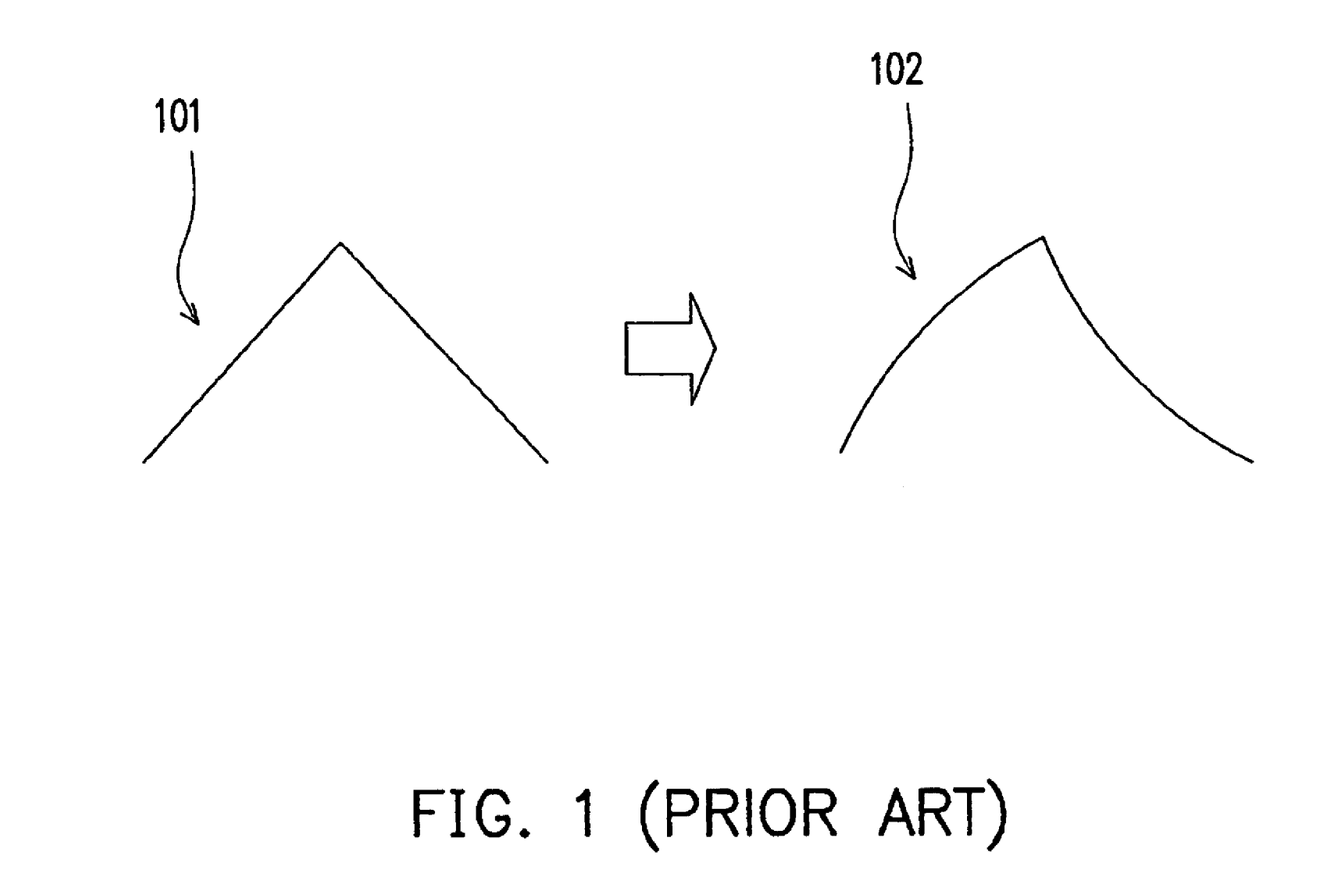
FIG. 1 shows waveforms of triangle wave before and after nonlinear distortion.

Most spread spectrum methods are developed for clock signals, but they are unsuitable for triangle wave signals. These methods introduce nonlinear distortion, for example, a triangle wave such as the signal 101 in FIG. 1, would become a distorted triangle wave signal such as the signal 102 in FIG. 1, after spreading spectrum. This distortion comes from continuous frequency disturbance, that is, when a slope part of the triangle wave is outputted, its output frequency keeps changing. Consequently, the linearity of the slope part is lost. The distortion is undesirable in some applications.

SUMMARY OF THE INVENTION

Accordingly, the present invention relates to a triangle wave generator with spread spectrum capability. This generator circuit does not distort its output waveform. In addition, this generator circuit supports a slave mode for providing a triangle wave synchronous with an external clock.

According to an embodiment of the present invention, a triangle wave generator is provided. The triangle wave generator includes a switch control circuit, a current generator, an integrator, and a spread spectrum control circuit. The switch control circuit is configured for providing an internal clock and a switch control signal. The switch control signal is generated according to the internal clock. The current generator is coupled to the switch control circuit for providing charge current according to the switch control signal. The integrator is coupled to the current generator for providing a triangle wave signal. The spread spectrum control circuit is coupled to the switch control circuit and the current generator. In addition, the spread spectrum control circuit is configured for providing a current control signal according to the internal clock. The current control signal controls current value of the charge current.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Reference will now be made in detail to the present embodiments of the invention, examples of which are illustrated in the accompanying drawings. Wherever possible, the same reference numbers are used in the drawings and the description to refer to the same or like parts.

Figure 2:
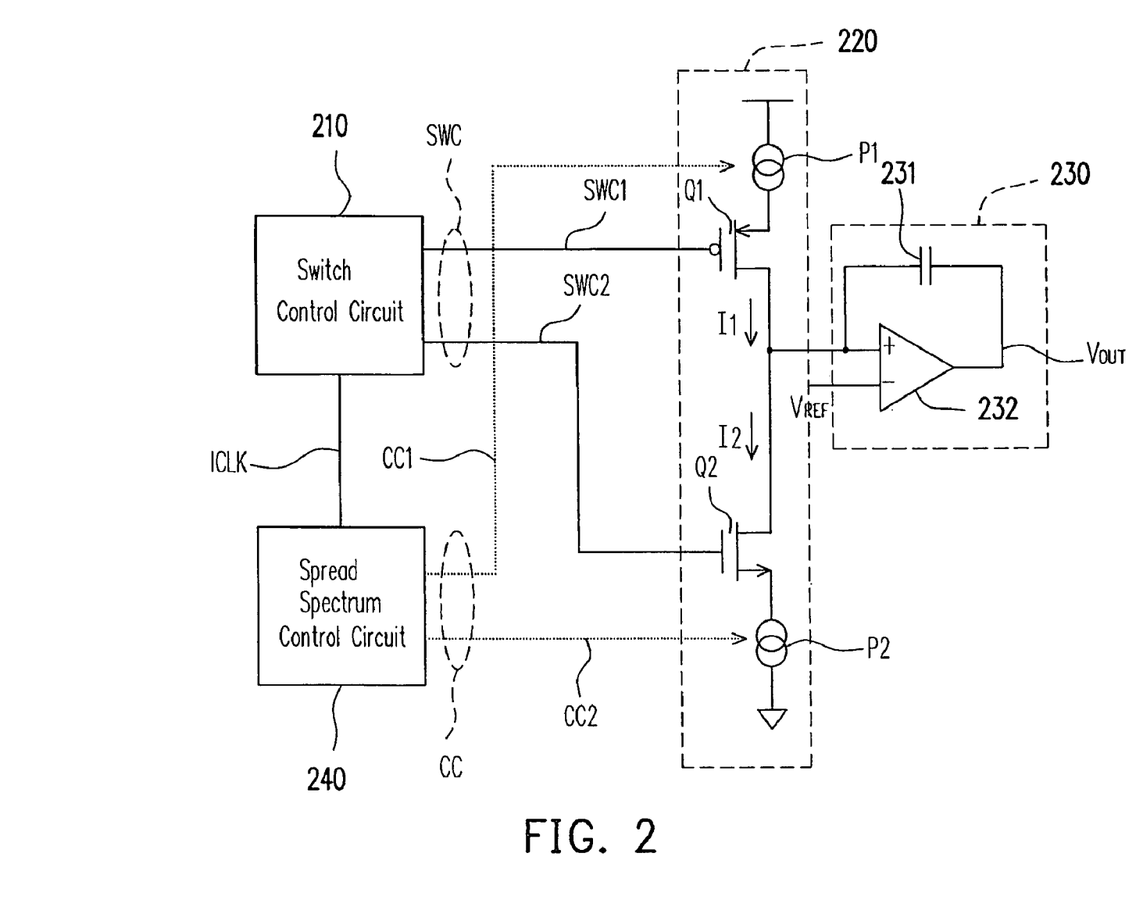
FIG. 2 is a schematic diagram showing a triangle wave generator according to an embodiment of the present invention.

FIG. 2 is a schematic diagram showing a triangle wave generator according to an embodiment of the present invention. The triangle wave generator includes a switch control circuit 210, a current generator 220, an integrator 230, and a spread spectrum control circuit 240. The current generator 220 is coupled to the switch control circuit 210. The integrator 230 is coupled to the current generator 220. The spread spectrum control circuit 240 is coupled to the switch control circuit 210 and the current generator 220.

The switch control circuit 210 is configured for providing an internal clock ICLK and a switch control signal SWC. The switch control signal SWC is generated according to the internal clock ICLK. In this embodiment, the switch control signal SWC includes two sub-signals, namely, the first switch control signal SWC1 and the second switch control signal SWC2.

The current generator includes two programmable current source sets P1 and P2 and two switches Q1 and Q2. The first switch Q1 is coupled between the first programmable current source set P1 and the integrator 230. The second switch Q2 is coupled to the integrator 230 and the second programmable current source set P2.

The first programmable current source set P1 provides the first current I1. The current value of I1 is determined by the first current control signal CC1. In fact, the first programmable current source set P1 supports a plurality of current paths corresponding to different current values, and the first current control signal CC1 decide which current path is selected to provide the first current I1. The first switch Q1 is configured to be turned on or turned off in response to the first switch control signal SWC1 to decide whether the first current I1 is selected to be the charge current to charge the capacitor 231. Similarly, the second switch Q2 is configured to be turned on or turned off in response to the second switch control signal SWC2 and the current value of I2 is determined by the first current control signal CC2.

The first switch control signal SWC1 and the second switch control signal SWC2 are generated based on the internal clock ICLK, and control signals SWC1 and SWC2 are designed to turn on and turn off the switches Q1 and Q2 alternately in each cycle of the internal clock ICLK. When Q1 is turned on, Q2 is turned off and the current generator 220 provides the first current I1 to the integrator 230. When Q2 is turned on, Q1 is turned off and the current generator 220 provides the second current I2 to the integrator 230. The integrator 230 provides the triangle wave signal $V_{OUT}$ according to the integration of the first current I1 or the second current I2 at the capacitor 231. As the switch control circuit 210 turns on switches Q1 and Q2 alternately, $V_{OUT}$ rises and falls alternately and becomes a triangle wave.

Figure 3A:
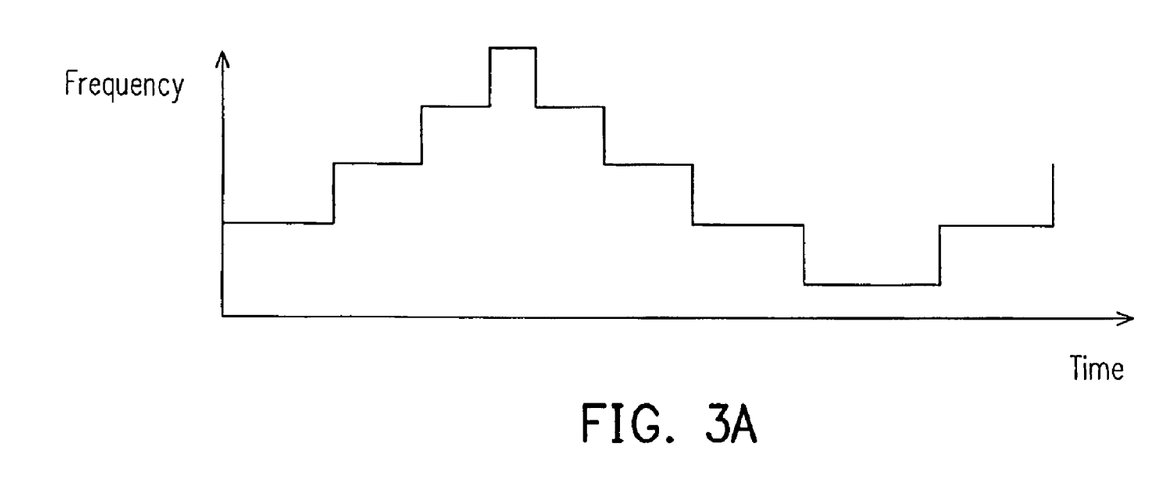
FIG. 3A and FIG. 3B show the characteristics of the output waveform of the generator circuit in FIG. 2.
Figure 3B:
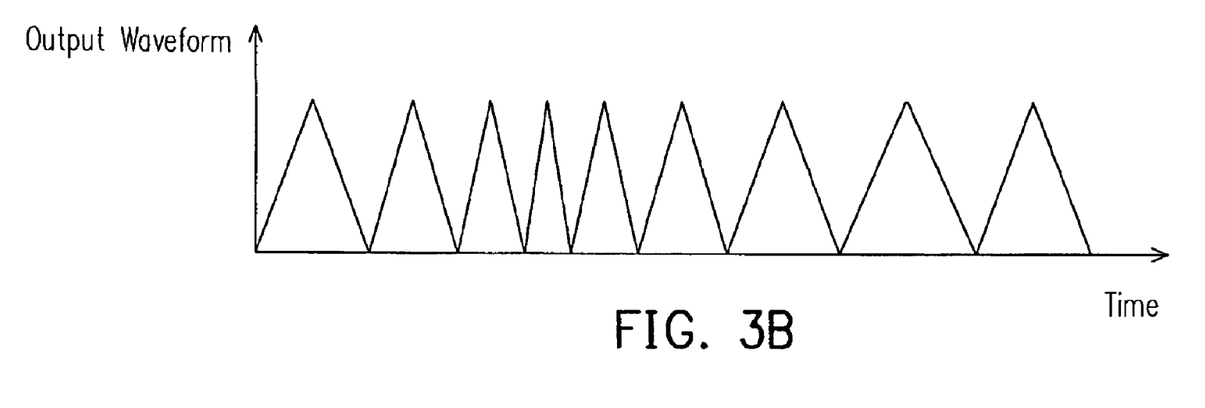

The spread spectrum control circuit 240 provides a current control signal CC according to the internal clock ICLK. In this embodiment, the current control signal CC includes two sub-signals, namely, the first current control signal CC1 and the second current control signal CC2. The first current control signal CC1 controls current value of the first current I1. The second current control signal CC2 controls current value of the second current I2. As currents I1 and I2 change, the capacitor 231 charges and discharges faster or slower and frequency of the triangle wave signal $V_{OUT}$ changes accordingly. Through the first current control signal CC1 and the second current control signal CC2, the spread spectrum control circuit 240 is capable of varying frequency of triangle wave periodically. As a result, the triangle wave signal $V_{OUT}$ achieves spread spectrum function, as shown in FIG. 3A and FIG. 3B.

Figure 4:
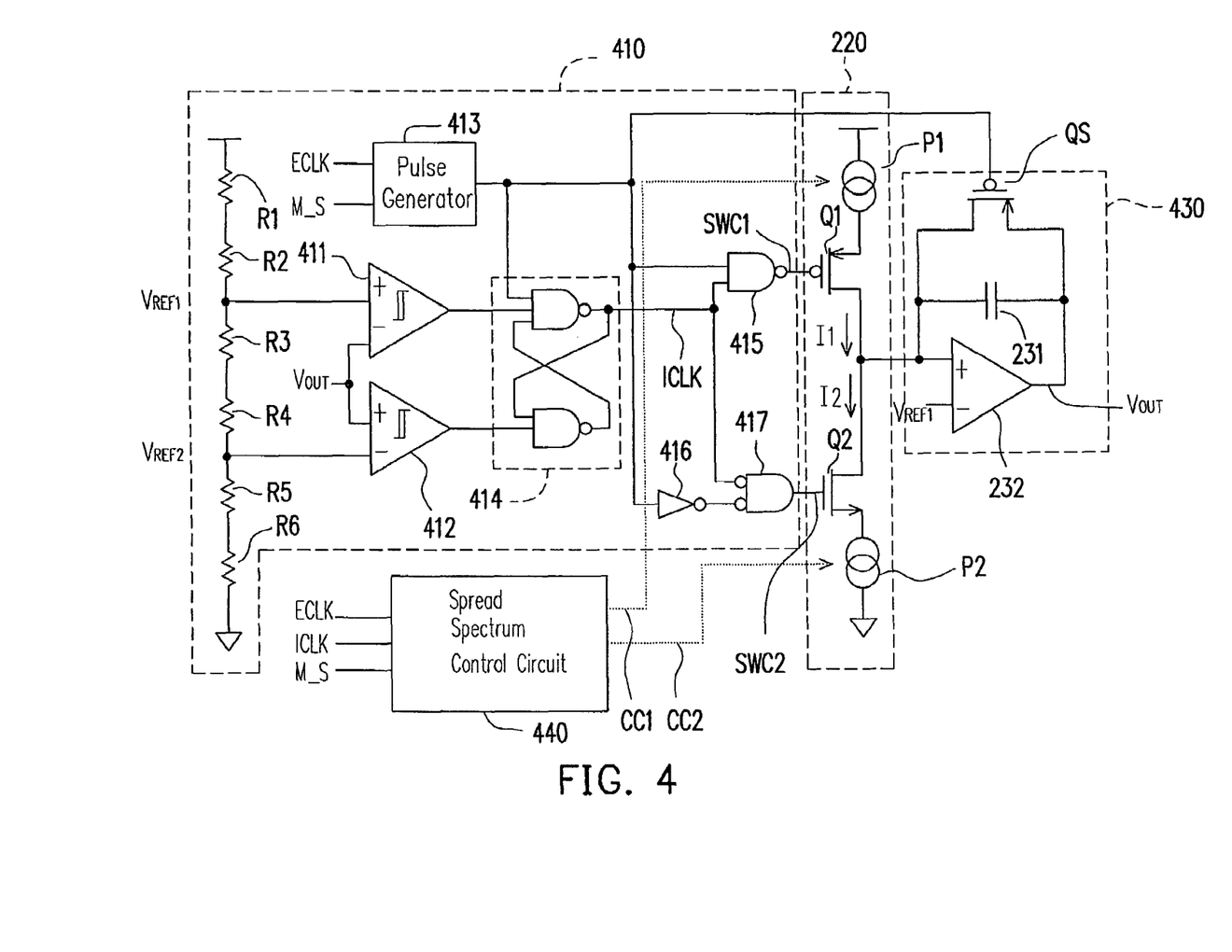
FIG. 4 is a schematic diagram showing a triangle wave generator according to another embodiment of the present invention.

FIG. 4 is a schematic diagram showing a more complex triangle wave generator according to another embodiment of the present invention. This triangle wave generator includes a switch control circuit 410, a current generator 220, an integrator 430, and a spread spectrum control circuit 440. The switch control circuit 410 includes six resistors R1-R6, a pulse generator 413, two comparators 411 and 412, an SR latch 414, and three logic gates 415-417. The current generator 220 is the same as its counterpart in FIG. 2. The integrator 430 includes a synchronization switch QS, a capacitor 231, and an operational amplifier 232. The details of the spread spectrum control circuit 440 will be shown later.

The triangle wave generator in FIG. 4 has two operating modes, namely, master mode and slave mode. The selection signal M_S determines the operating mode of the triangle wave generator.

If the selection signal M_S is in a master state, the triangle wave generator operates in the master mode, in which the triangle wave generator provides the triangle wave signal $V_{OUT}$ on its own and does not have to follow any external signal. In the master mode, output of the pulse generator 413 is always at high level such that it has no effect on the SR latch 414 and the logic gates 415-417. The resistors R1-R6 constitute a voltage divider and provide two reference voltages $V_{REF1}$ and $V_{REF2}$, which are the upper bound and the lower bound of the triangle wave signal $V_{OUT}$, respectively. When the triangle wave signal $V_{OUT}$ reaches the upper bound $V_{REF1}$, the comparator 411 outputs a low pulse which brings the internal clock ICLK provided by the SR latch 414 to logic high. The high level of the internal clock ICLK turns on the first switch Q1 and turns off the second switch Q2. Consequently, the first current I1 charges the capacitor 231 and decreases voltage of the triangle wave signal $V_{OUT}$. When the triangle wave signal $V_{OUT}$ reaches the lower bound $V_{REF2}$, the comparator 412 outputs a low pulse which brings the internal clock ICLK to logic low. The low level of the internal clock ICLK turns off the first switch Q1 and turns on the second switch Q2. Consequently, the second current I2 discharges the capacitor 231 and increases voltage of the triangle wave signal $V_{OUT}$. Next, the triangle wave signal $V_{OUT}$ reaches the upper bound $V_{REF1}$ again and begins the next cycle.

If the selection signal M_S is in a slave state, the triangle wave generator operates in the slave mode, in which the triangle wave generator synchronizes the triangle wave signal $V_{OUT}$ with the external clock ECLK. The external clock ECLK may be supported by the internal clock ICLK of another triangle wave generator. In the slave mode, the pulse generator 413 outputs periodic low pulses synchronous with the external clock signal ECLK. Each time a low pulse is outputted, the low pulse turns off the switches Q1 and Q2, turns on the synchronization switch QS, therefore the capacitor 231 is shorted and clamping the triangle wave signal $V_{OUT}$ to its upper bound voltage $V_{REF1}$. At ending of the pulse, the high level of the internal clock ICLK turns on the first switch Q1 and the first current I1 decreases the triangle wave signal $V_{OUT}$ toward its lower bound voltage $V_{REF2}$. In this way the triangle wave signal $V_{OUT}$ is synchronous with the external clock ECLK.

Figure 5A:
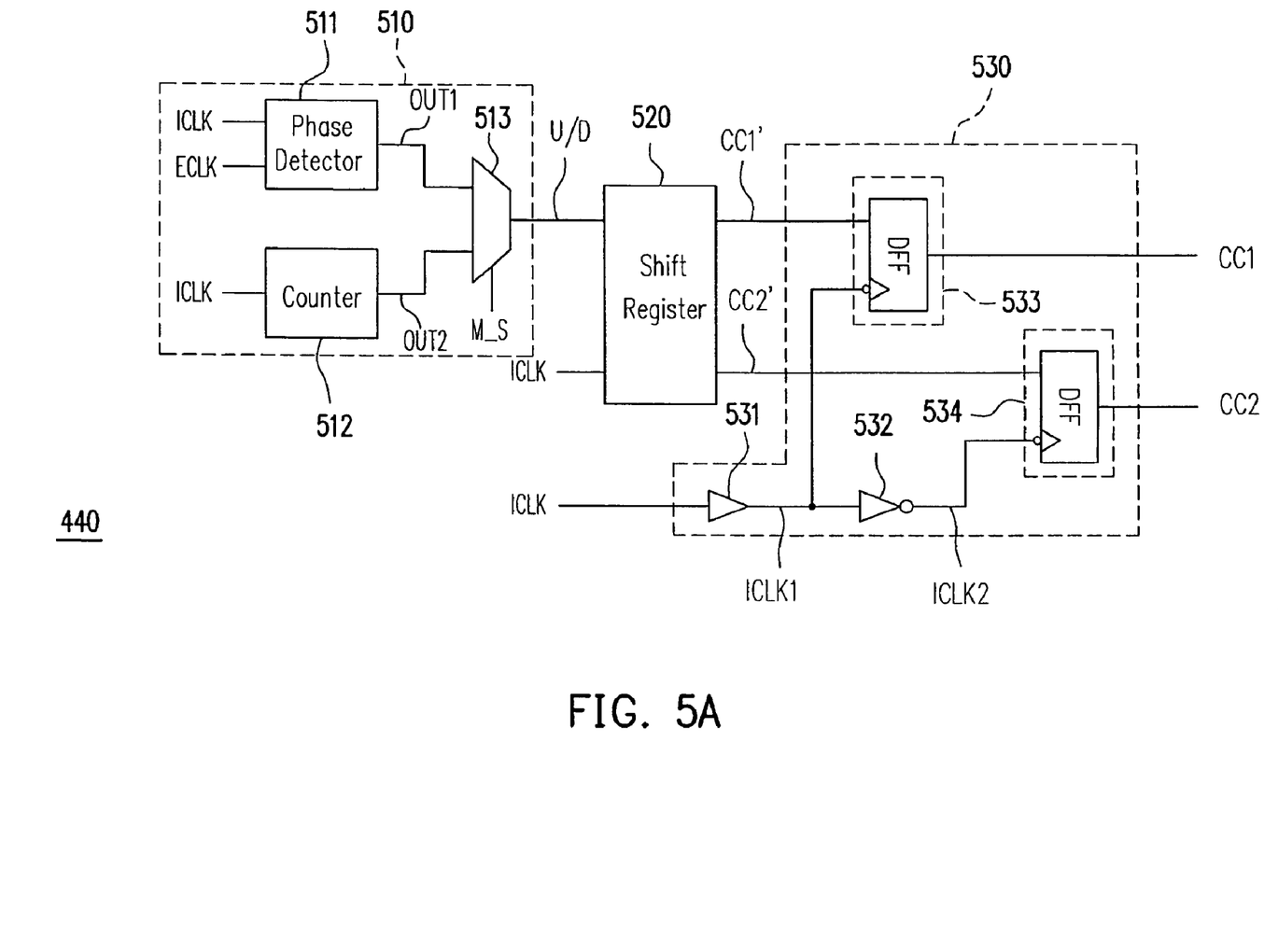
FIG. 5A is a schematic diagram showing the spread spectrum control circuit in FIG. 4.

FIG. 5A is a schematic diagram showing the spread spectrum control circuit 440 in this embodiment. The spread spectrum control circuit 440 includes an adjustment circuit 510, a shift register 520, and a delay circuit 530. The shift register 520 is coupled to the adjustment circuit 510. The delay circuit 530 is coupled between the shift register 520 and the switches Q1 and Q2 of the current generator 220.

The adjustment circuit 510 controls frequency of the triangle wave signal $V_{OUT}$ via the up-down signal U/D in both the master mode and the slave mode. The adjustment circuit 510 includes a phase detector 511, a counter 512, and a multiplexer 513. The multiplexer 513 is coupled to both the phase detector 511 and the counter 512.

Figure 6A:
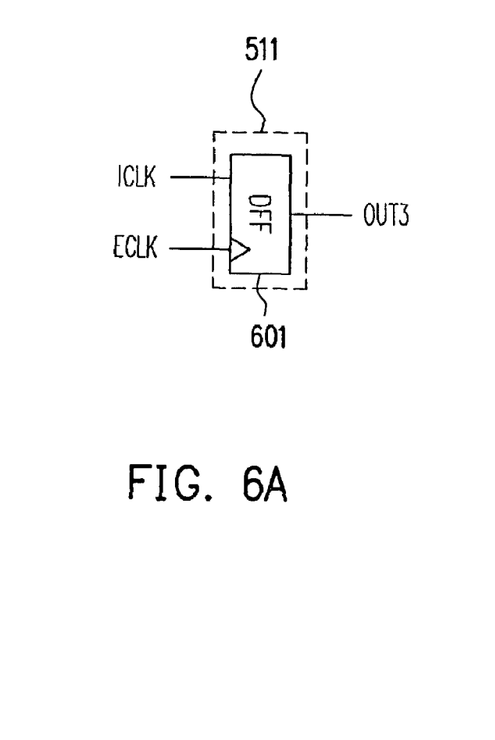
FIG. 6A is a schematic diagram showing the phase detector in FIG. 5A.

The multiplexer 513 is controlled by selection signal M_S, if the selection signal M_S is in a slave state level, the multiplexer switches OUT1 as the up-down signal U/D; if the selection signal M_S is in a master state level, the multiplexer switches OUT2 as the up-down signal U/D. Therefore, the phase detector 511 controls frequency of the triangle wave signal $V_{OUT}$ in the slave mode. For this purpose, the phase detector 511 is configured for providing a first output signal OUT1 according to the phase difference between the internal clock ICLK and the external clock ECLK. As shown in FIG. 6A, the phase detector 511 includes a D flip-flop (DFF) 601 which is configured for sampling and detecting the internal clock ICLK the external clock signal ECLK. Please refer to FIG. 6B. The frequency of the internal clock ICLK is equal to the frequency of the triangle wave signal $V_{OUT}$. If the frequency of the internal clock is higher than that of the external clock signal, as shown by ICLK and ECLK_1 in FIG. 6B. At the moment $T_4$, the rising edge of the external clock signal ECLK_1 triggers the D flip-flop 601. The D flip-flop 601 samples the internal clock signal ICLK and outputs high logic level as the signal OUT3, which means the currents I1 and I2 should be decreased to lower the frequency of the internal clock ICLK.

Figure 6B:
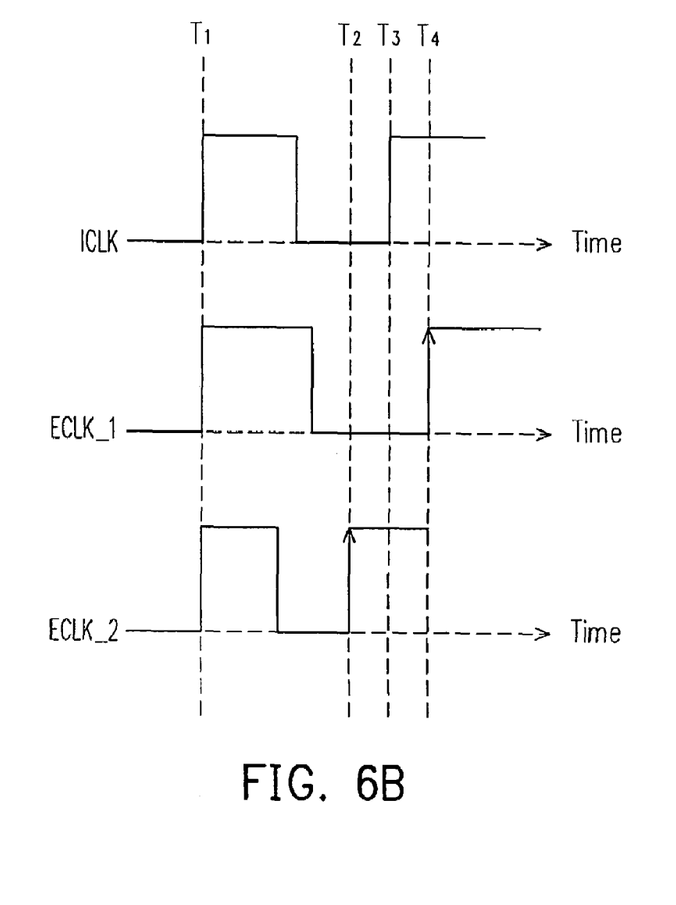
FIG. 6B shows the operation of the phase detector in FIG. 6A.

On the other hand, if the frequency of the internal clock is lower than that of the external clock, as shown by ICLK and ECLK_2 in FIG. 6B. At the moment $T_2$, the rising edge of the external clock signal ECLK_2 triggers the D flip-flop 601. The D flip-flop 601 samples the internal clock signal ICLK and outputs low logic level as the signal OUT3, which means the currents I1 and I2 should be increased to heighten frequency of the internal clock ICLK. In the slave mode, the signal OUT3 may be used to generate the up-down signal U/D or be used as the up-down signal U/D directly. In this way the spread spectrum control circuit 440 can control the currents I1 and I2 in the slave mode according to the phase difference between the internal clock ICLK and the external clock ECLK. At a steady state, the internal clock ICLK shall be synchronous with the external clock ECLK.

Figure 7:
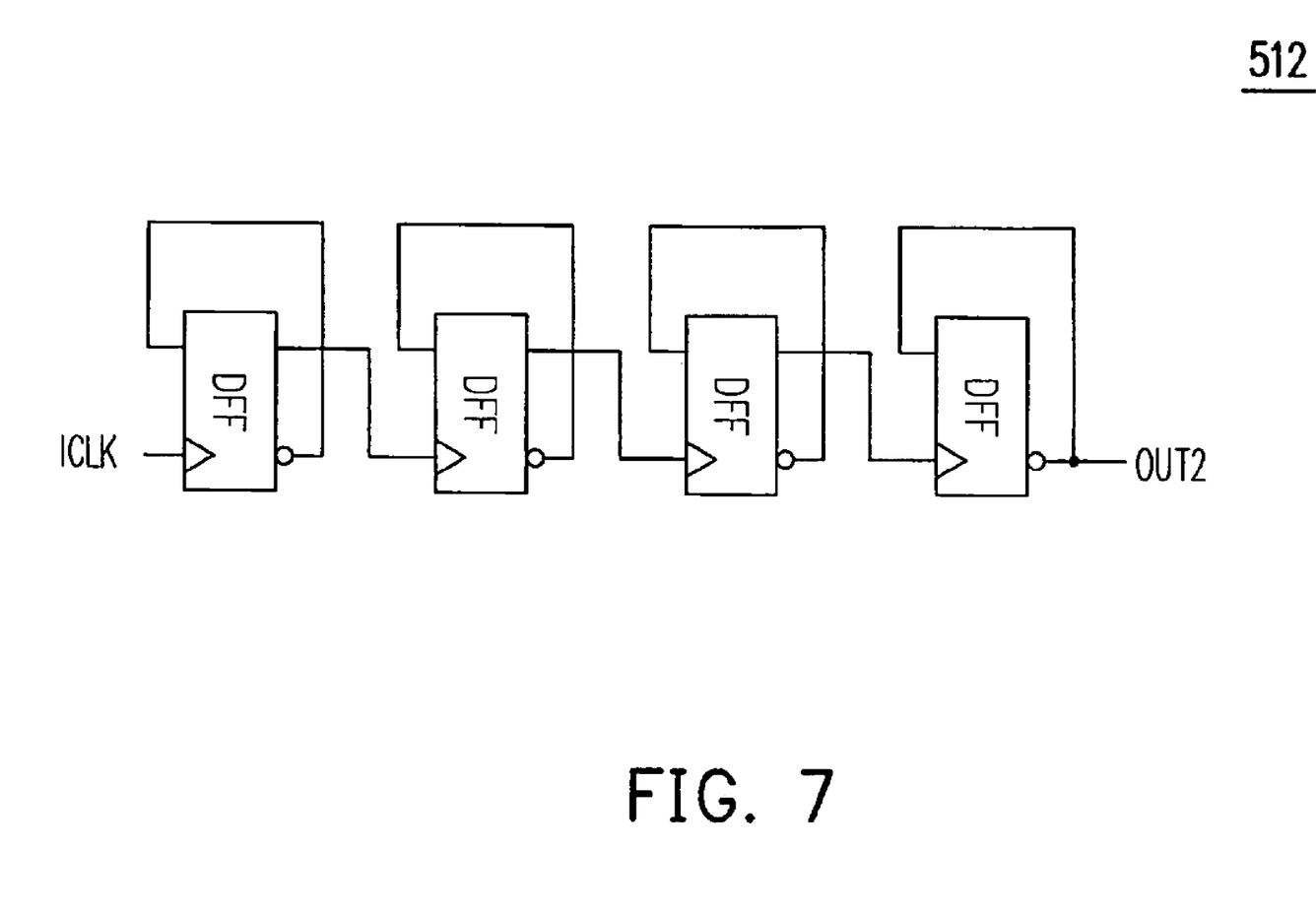
FIG. 7 is a schematic diagram showing the counter in FIG. 5A.

The counter 512 controls frequency of the triangle wave signal $V_{OUT}$ in the master mode. For this purpose, the counter 512 is configured for counting the internal clock ICLK and providing the result of the frequency dividing as a second output signal OUT2. The counter 512 may be a ripple counter, as shown in FIG. 7. The ripple counter divides the frequency of the internal clock ICLK by 16. In the master mode, the signal OUT2 is used as the up-down signal U/D to control frequency of the triangle wave signal $V_{OUT}$. Therefore frequency of the triangle wave signal $V_{OUT}$ keeps increasing for 8 cycles of the internal clock ICLK and then keeps decreasing for another 8 cycles of the internal clock ICLK. The frequency division can be adjusted by using more or less D flip-flops in the ripple counter.

Figure 5B:
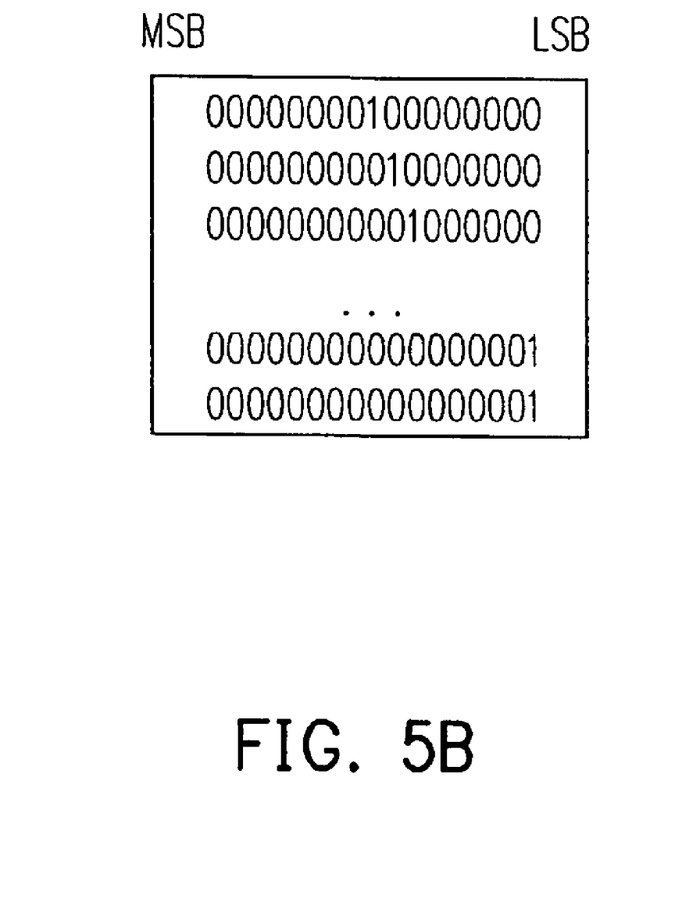
FIG. 5B and FIG. 5C are bit tables showing one example status of the shift register output in FIG. 5A.
Figure 5C:
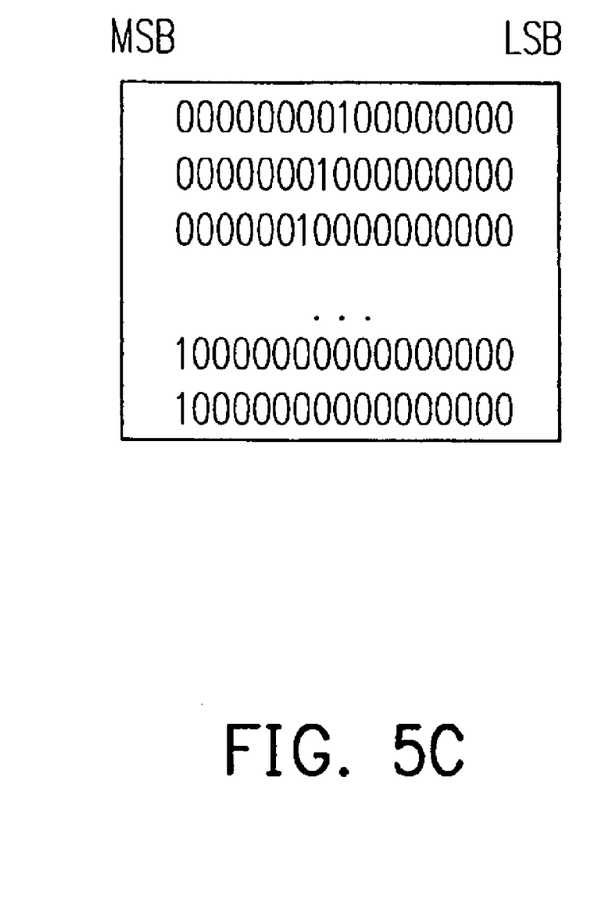

The shift register 520 is coupled to the multiplexer 513 of the adjustment circuit 510 and is configured for providing the first control signal CC1' and the second control signal CC2' according to the up-down signal U/D. The shift register 520 provides the first control signal CC1' as a plurality of bits. One of the bits is 1 and the other bits are 0. The shift register 520 shifts the bit of 1 according to the up-down signal. For example, if the up-down signal U/D indicates that the frequency of the triangle wave signal $V_{OUT}$ should be increased, the bit of 1 may be moved toward the least significant bit (LSB), as shown in FIG. 5B. If the up-down signal U/D indicates that the frequency of the triangle wave signal $V_{OUT}$ should be decreased, the bit of 1 may be moved toward the most significant bit (MSB), as shown in FIG. 5C. Similarly, the shift register 520 provides the second control signal CC2' in the same manner. As discussed later, the position of the bit of 1 determines current value of the currents I1 and I2.

The delay circuit 530 delays the first control signal CC1' and the second control signal CC2' according to the internal clock ICLK in order to maintain the linearity of the triangle wave signal $V_{OUT}$. The delay circuit 530 is coupled between the shift register 520 and the programmable current source sets P1 and P2 of the current generator 220. The delay circuit 530 includes a delay unit 531, a first D flip-flop module 533 coupled to the shift register 520 and the delay unit 531, an inverter 532 coupled to the delay unit 531, and a second D flip-flop module 534 coupled to the shift register 520 and the inverter 532.

The delay unit 531 is configured for delaying the internal clock ICLK for a predetermined time. It is preferable that the predetermined time is less than half the period of the internal clock ICLK. The first D flip-flop module 533 is configured for delaying the first control signal CC1' until receiving a falling edge of the output signal ICLK1 of the delay unit 531. After delay, the first current control signal CC1 is generated to control the first programmable current source set for providing the first current I1 from a set of different current values. In fact, the first D flip-flop module 533 includes a plurality of D flip-flops. Each D flip-flop delays one bit of the first current control signal CC1. All the D flip-flops are triggered by the falling edges of the output signal ICLK1 of the delay unit 531. The inverter 532 separates trigger time between the first D flip-flop module 533 and the second D flip-flop module 534. The inverter 532 is configured for receiving the output signal ICLK1 of the delay unit 531. The second D flip-flop module 534 delays the second control signal CC2' until receiving a falling edge of the output signal ICLK2 of the inverter 532. After delay, the second current control signal CC2 is generated to control the second programmable current source set for providing the second current I2 from a set of different current values. Similarly, the second D flip-flop module 534 includes a plurality of D flip-flops. Each D flip-flop delays one bit of the second current control signal CC2. All the D flip-flops are triggered by the falling edges of the output signal ICLK2 of the inverter 532.

Figure 8:
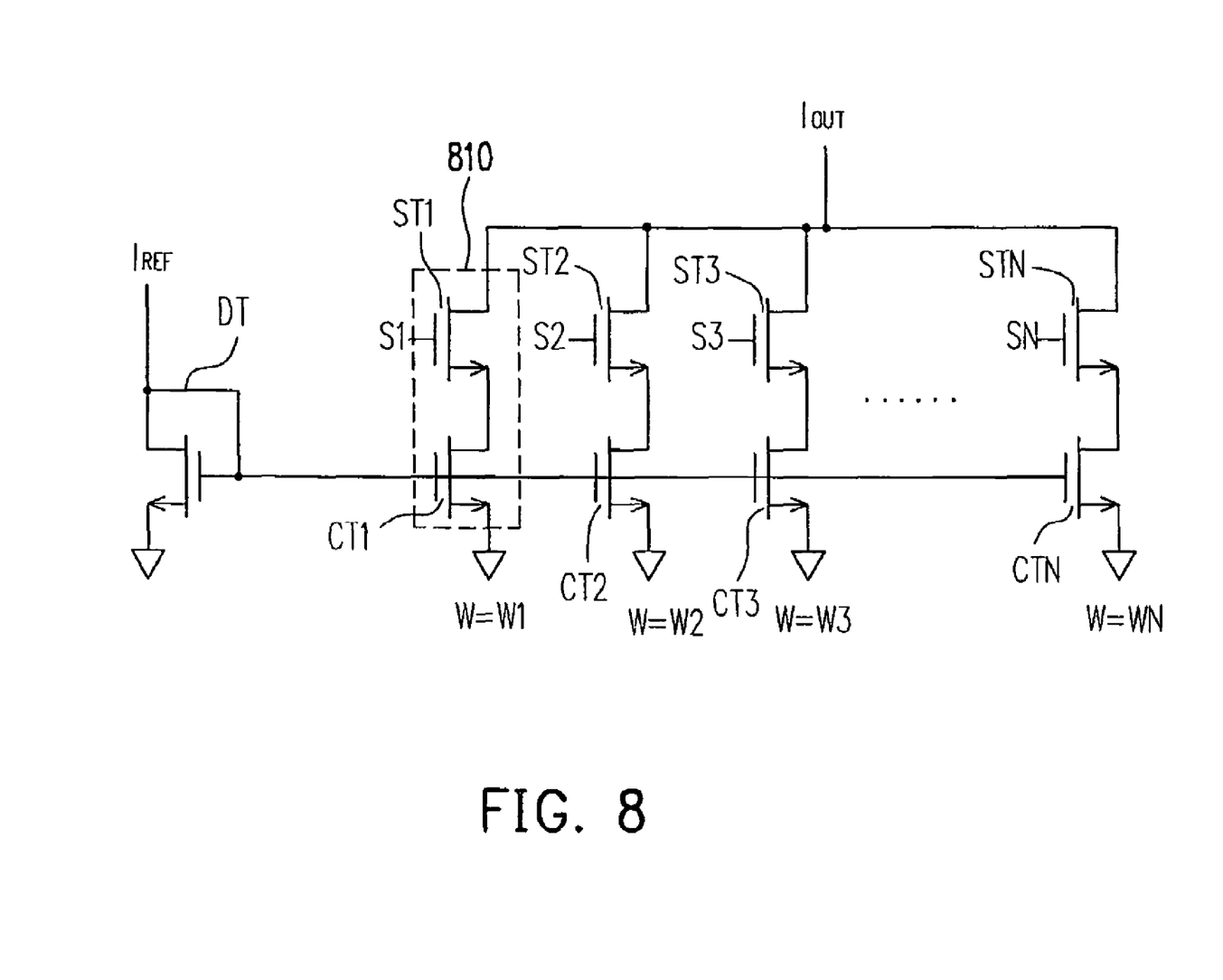
FIG. 8 is a schematic diagram showing the architecture of the two programmable current sources in FIG. 4.

The first current control signal CC1 and the second current control signal CC2 are provided to the programmable current sources P1 and P2. The design of P1 and P2 are shown in FIG. 8. Each of P1 and P2 includes a current mirror set with a plurality of current path responding to different current value. Each of the current paths includes a switch transistor (ST1-STN) and a current transistor (CT1-CTN). For example, the current path 810 includes the switch transistor ST1 and the current transistor CT1. Each of the current transistors CT1-CTN has different channel width. The widths W1-WN of the current transistors CT1-CTN are determined according to an increasing sequence or a decreasing sequence. Each of the switch transistors ST1-STN is coupled to the corresponding current transistor CT1-CTN.

Each of the switch transistors ST1-STN of the first programmable current source set P1 is configured to be turned on or turned off in response to one of bits of the first current control signal CC1, shown as S1-SN in FIG. 8. Since only one bit of the first current control signal CC1 is 1 and the other bits are 0, only one of the switch transistors ST1-STN is turned on. The current transistor coupled to the turned-on switch transistor provides the first current I1 through the turned-on switch transistor. In the case that W1<W2<W3< . . . <WN, current value of the first current I1 increases as the bit of 1 moves toward SN and decreases as the bit of 1 moves toward S1, and vice versa. The design of the second programmable current source P2 is the same as that of P1. Therefore P2 works in the way as P1 does. Each of the switch transistors ST1-STN of the second programmable current source P2 is configured to be turned on or turned off in response to one of the bits of the second current control signal CC2.

Figure 9:
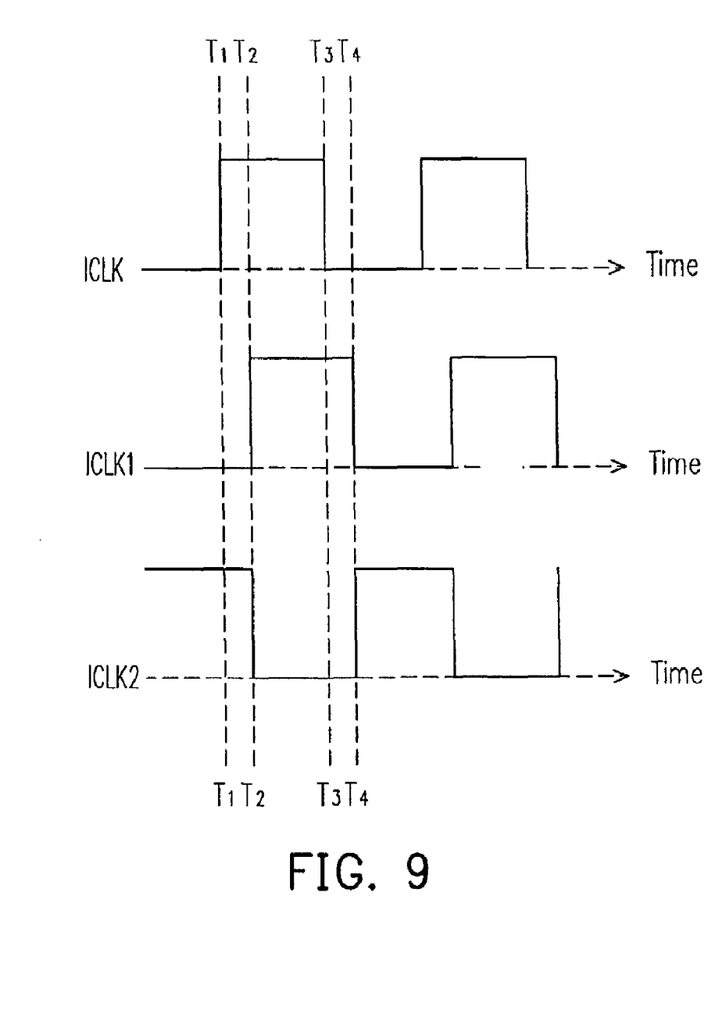
FIG. 9 shows the operation of the delay circuit in FIG. 5A.

About the purpose of the delay circuit 530, please refer to FIG. 9. FIG. 9 shows an example of the internal clock ICLK and the signals ICLK1 and ICLK2 in the delay circuit 530. There is a delay caused by the delay unit 531 between the internal clock ICLK and the signals ICLK1 and ICLK2. In order to maintain the linearity of the triangle wave signal $V_{OUT}$, the adjustment of the first current I1 or the second current I2 must be done when it is cut off from the integrator 430. Therefore the delay circuit 530 delivers the first current control signal CC1 to the first programmable current source set P1 when the first switch Q1 is turned off and delivers the second current control signal CC2 to the second programmable current source set P2 when the second switch Q2 is turned off. As shown in FIG. 9, at the moment $T_2$, the internal clock ICLK is at logic high, the second switch Q2 is turned off, and the falling edge of the signal ICLK2 triggers the second D flip-flop module 534 to deliver the second current control signal CC2 to the second programmable current source set P2. At the moment $T_4$, the internal clock ICLK is at logic low, the first switch Q1 is turned off, and the falling edge of the signal ICLK1 triggers the first D flip-flop module 533 to deliver the first current control signal CC1 to the first programmable current source set P1. The delay caused by the delay unit 531 prevents timing glitches between the two current control signals CC1-CC2 and the two switch control signals SWC1-SWC2.

In summary, the triangle wave generator and its spread spectrum control circuit in the above embodiments have spread spectrum capability. They keep the linearity of the triangle output waveform. In addition, they support a master mode and a slave mode. In the master mode, the triangle wave generator provides the triangle wave signal on its own without regard to any external signal. In the slave mode, the triangle wave signal is synchronous with an external clock signal.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A triangle wave generator with function of spreading frequency spectrum, comprising:
    a switch control circuit for providing an internal clock and a switch control signal, wherein the switch control signal is generated according to the internal clock;
    a current generator coupled to the switch control circuit for providing a first current or a second current according to the switch control signal;
    an integrator coupled to the current generator for integrating the first current or the second current to generate a triangle wave signal; and
    a spread spectrum control circuit coupled to the switch control circuit and the current generator, for providing a current control signal according to the internal clock in a master mode and according to the internal clock and an external clock in a slave mode, wherein the current control signal controls values of the first current and the second current.

2. The triangle wave generator of claim 1, wherein the current control signal comprises a first current control signal and a second current control signal, and the current generator comprises:
    a first programmable current source set for providing the first current from a set of different current values according to the first current control signal;
    a first switch coupled between the first programmable current source set and the integrator, turned on or turned off in response to the switch control signal;
    a second programmable current source set for providing the second current from a set of different current values according to the second current control signal; and
    a second switch coupled to the second programmable current source set and the integrator, turned on or turned off in response to the switch control signal.

3. The triangle wave generator of claim 2, wherein the spread spectrum control circuit comprises:
    an adjustment circuit for providing an up-down signal according to a phase difference between the internal clock and the external clock if the triangle wave generator is in the slave mode, and providing the up-down signal according to the internal clock if the triangle wave generator is in the master mode;
    a shift register coupled to the adjustment circuit for providing the current control signal according to the up-down signal; and
    a delay circuit coupled between the shift register and the current generator, for delaying the first current control signal and the second current control signal according to the internal clock.

4. The triangle wave generator of claim 3, wherein the adjustment circuit comprises:
    a phase detector for providing a first output signal according to the phase difference between the internal clock and the external clock;
    a counter for counting the internal clock to divide frequency of the internal clock as a second output signal; and
    a multiplexer coupled to the phase detector and the counter, for providing one of the first output signal and the second output signal as the up-down signal according to a mode-selection signal.

5. The triangle wave generator of claim 4, wherein the phase detector comprises:
    a D flip-flop configured for sampling and detecting the internal clock and the external clock, wherein the up-down signal is generated based on the output of the D flip-flop.

6. The triangle wave generator of claim 3, wherein the delay circuit delivers the first current control signal to the first programmable current source set when the first switch is turned off and delivers the second current control signal to the second programmable current source set when the second switch is turned off.

7. The triangle wave generator of claim 6, wherein the delay circuit comprises:
    a delay unit for delaying the internal clock for a predetermined time;
    a first D flip-flop module coupled to the shift register and the delay unit, for delaying the first current control signal until receiving a falling edge of the output of the delay unit;
    an inverter coupled to the delay unit for receiving the output of the delay unit; and
    a second D flip-flop module coupled to the shift register and the inverter, for delaying the second current control signal until receiving a falling edge of the output of the inverter.

8. The triangle wave generator of claim 7, wherein the predetermined time is less than half period of the internal clock.

9. The triangle wave generator of claim 3, wherein
    the shift register provides the first current control signal as a plurality of bits, one of the bits is 1 and the other bits are 0, the shift register shifts the bit of 1 according to the up-down signal; and
    the shift register also provides the second current control signal as a plurality of bits, one of the bits is 1 and the other bits are 0, the shift register shifts the bit of 1 according to the up-down signal.

10. The triangle wave generator of claim 9, wherein each of the first and the second programmable current sources set comprises:
    a current mirror set with a plurality of current path responding to different current value; and
    a plurality of switch connecting to the current path and is controlled by the bits of the current control signal for determining charge current flowing into the integrator.

* * * * *